US006060218A

United States Patent [19]

[11] Patent Number: 6,060,218

[45] Date of Patent: May 9, 2000

Van Damme et al.

[54] METHOD FOR MAKING POSITIVE WORKING PRINTING PLATES FROM A HEAT MODE SENSITIVE IMAGE ELEMENT

[75] Inventors: Marc Van Damme, Heverlee; Joan Vermeersch, Deinze; Geert Deroover, Kessel-Lo, all of Belgium

[73] Assignee: AGFA-Gevaert, N.V., Mortsel, Belgium

[21] Appl. No.: 09/163,372

[22] Filed: Sep. 30, 1998

Related U.S. Application Data

[60] Provisional application No. 60/069,405, Dec. 18, 1997.

[30] Foreign Application Priority Data

Oct. 8, 1997 [EP] European Pat. Off. .............. 97203129

[51] Int. Cl.$^{7}$ .............. G03F 7/30

[52] U.S. Cl. .............. 430/302; 430/270.1; 430/278.1; 430/944

[58] Field of Search .............. 430/302, 270.1, 430/278.1, 944

[56] References Cited

U.S. PATENT DOCUMENTS

| | | | |
|---|---|---|---|
| 5,466,557 | 11/1995 | Haley et al. . | |
| 5,536,619 | 7/1996 | Verburgh | 430/73.1 |
| 5,840,467 | 11/1998 | Kitatani et al. | 430/302 |
| 5,858,604 | 1/1999 | Takeda et al. | 430/162 |

FOREIGN PATENT DOCUMENTS

| | | |
|---|---|---|
| 0 347 245 A2 | 12/1989 | European Pat. Off. . |
| 0 347 245 A3 | 12/1989 | European Pat. Off. . |
| 0 732 628 A1 | 9/1996 | European Pat. Off. . |
| 1154568 | 6/1969 | United Kingdom . |
| 1155035 | 6/1969 | United Kingdom . |
| 1160221 | 8/1969 | United Kingdom . |
| 1245924 | 9/1971 | United Kingdom . |

*Primary Examiner*—Janet Baxter
*Assistant Examiner*—Barbara Gilmore
*Attorney, Agent, or Firm*—Breiner & Breiner

[57] ABSTRACT

According to the present invention there is provided a method for making lithographic printing plates including the following steps a) preparing a heat mode imaging element consisting of a lithographic base with a hydrophilic surface and a top layer which top layer is sensitive to IR-radiation, comprises a polymer, soluble in an aqueous alkaline solution and is unpenetrable for an alkaline developer containing $SiO_2$ as silicates;

b) exposing imagewise said heat mode imaging element to IR-radiation;

c) developing said imagewise exposed heat mode imaging element with said alkaline developer so that the exposed areas of the top layer are dissolved and the unexposed areas of the top layer remain undissolved characterized in that said top layer includes an IR-dye selected from the group consisting of indoaniline dyes, cyanine dyes, merocyanine dyes, oxonol dyes, porphine derivatives, anthraquinone dyes, merostyryl dyes, pyrylium compounds, diphenyl and triphenyl azo compounds and squarylium derivatives.

6 Claims, No Drawings

METHOD FOR MAKING POSITIVE WORKING PRINTING PLATES FROM A HEAT MODE SENSITIVE IMAGE ELEMENT

RELATED APPLICATION

The present application claims benefit of U.S. Provisional Application Ser. No. 60/069,405 filed Dec. 18, 1997.

FIELD OF THE INVENTION

The present invention relates to a method for preparing a lithographic printing plate using a heat mode imaging element comprising an IR sensitive top layer.

More specifically the invention is related to a method for preparing a lithographic printing plate using a heat mode imaging element whereby the capacity of the top layer of being penetrated and/or solubilised by an aqueous developer is changed upon exposure.

BACKGROUND OF THE INVENTION

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography, a photographic material is made imagewise receptive to oily or greasy inks in the photo-exposed (negative-working) or in the non-exposed areas (positive-working) on a hydrophilic background.

In the production of common lithographic printing plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Upon imagewise exposure of the light-sensitive layer the exposed image areas become insoluble and the unexposed areas remain soluble. The plate is then developed with a suitable liquid to remove the diazonium salt or diazo resin in the unexposed areas.

Alternatively, printing plates are known that include a photosensitive coating that upon image-wise exposure is rendered soluble at the exposed areas. Subsequent development then removes the exposed areas. A typical example of such photosensitive coating is a quinone-diazide based coating.

Typically, the above described photographic materials from which the printing plates are made are camera-exposed through a photographic film that contains the image that is to be reproduced in a lithographic printing process. Such method of working is cumbersome and labor intensive. However, on the other hand, the printing plates thus obtained are of superior lithographic quality.

Attempts have thus been made to eliminate the need for a photographic film in the above process and in particular to obtain a printing plate directly from computer data representing the image to be reproduced. However the photosensitive coating is not sensitive enough to be directly exposed with a laser. Therefor it has been proposed to coat a silver halide layer on top of the photosensitive coating. The silver halide can then directly be exposed by means of a laser under the control of a computer. Subsequently, the silver halide layer is developed leaving a silver image on top of the photosensitive coating. That silver image then serves as a mask in an overall exposure of the photosensitive coating. After the overall exposure the silver image is removed and the photosensitive coating is developed. Such method is disclosed in for example JP-A-60-61 752 but has the disadvantage that a complex development and associated developing liquids are needed.

GB-1 492 070 discloses a method wherein a metal layer or a layer containing carbon black is provided on a photosensitive coating. This metal layer is then ablated by means of a laser so that an image mask on the photosensitive layer is obtained. The photosensitive layer is then overall exposed by UV-light through the image mask. After removal of the image mask, the photosensitive layer is developed to obtain a printing plate. This method however still has the disadvantage that the image mask has to be removed prior to development of the photosensitive layer by a cumbersome processing.

Furthermore methods are known for making printing plates involving the use of imaging elements that are heat-sensitive rather than photosensitive. A particular disadvantage of photosensitive imaging elements such as described above for making a printing plate is that they have to be shielded from the light. Furthermore they have a problem of sensitivity in view of the storage stability and they show a lower resolution. The trend towards heat mode printing plate precursors is clearly seen on the market.

For example, Research Disclosure no. 33303 of January 1992 discloses a heat mode imaging element comprising on a support a cross-linked hydrophilic layer containing thermoplastic polymer particles and an infrared absorbing pigment such as e.g. carbon black. By image-wise exposure to an infrared laser, the thermoplastic polymer particles are image-wise coagulated thereby rendering the surface of the imaging element at these areas ink-acceptant without any further development. A disadvantage of this method is that the printing plate obtained is easily damaged since the non-printing areas may become ink accepting when some pressure is applied thereto. Moreover, under critical conditions, the lithographic performance of such a printing plate may be poor and accordingly such printing plate has little lithographic printing latitude.

U.S. Pat. No. 4,708,925 discloses imaging elements including a photosensitive composition comprising an alkali-soluble novolac resin and an onium-salt. This composition can optionally contain an IR-sensitizer. After image-wise exposing said imaging element to UV-visible—or IR-radiation followed by a development step with an aqueous alkali liquid there is obtained a positive or negative working printing plate. The printing results of a lithographic plate obtained by irradiating and developing said imaging element are poor.

EP-A-625 728 discloses an imaging element comprising a layer which is sensitive to UV- and IR-irradiation and which can be positive or negative working. This layer comprises a resole resin, a novolac resin, a latent Bronsted acid and an IR-absorbing substance. The printing results of a lithographic plate obtained by irradiating and developing said imaging element are poor.

U.S. Pat. No. 5,340,699 is almost identical with EP-A-625 728 but discloses the method for obtaining a negative working IR-laser recording imaging element. The IR-sensitive layer comprises a resole resin, a novolac resin, a latent Bronsted acid and an IR-absorbing substance. The printing results of a lithographic plate obtained by irradiating and developing said imaging element are poor.

Furthermore EP-A-678 380 discloses a method wherein a protective layer is provided on a grained metal support underlying a laser-ablatable surface layer. Upon image-wise exposure the surface layer is fully ablated as well as some parts of the protective layer. The printing plate is then treated with a cleaning solution to remove the residu of the protective layer and thereby exposing the hydrophilic surface layer.

EP-A-97 200 588.8 discloses a heat mode imaging element for making lithographic printing plates comprising on a lithographic base having a hydrophilic surface an intermediate layer comprising a polymer, soluble in an aqueous alkaline solution and a top layer that is sensitive to IR-radiation wherein said top layer upon exposure to IR-radiation has a decreased or increased capacity for being penetrated and/or solubilised by an aqueous alkaline solution.

Said heat-mode imaging element has the disadvantage that on the lithographic surface having a hydrophilic surface two layers have to be coated from a solvent, which is a cumbersome operation. Furtheron said heat-mode imaging element has the disadvantage that some ablation occurs during the irradiation causing formation of some debris. Said debris can interfere with the transmission of the laser beam ( e.g. by depositing on a focusing lens or as an aerosol that partially blocks transmission) or with the transport of the imaging element during or after recording when this debris remains loosely adhered to the plate and deposition of said debris occurs on the transport rollers.

GB-A-1 245 924 discloses an information recording method wherein a recording material is used comprising a heat-sensitive recording layer of a composition such that the solubility of any given area of the layer in a given solvent can be increased by heating that area of the layer, wherein the said layer is information-wise heated to produce a record of the information in terms of a difference in the solubilities in the said solvent of different areas of the recording layer, and wherein the whole layer is then contacted with such solvent to cause the portions of the recording layer which are soluble or most soluble in such solvent to be removed or penetrated by such solvent.

EP-A-347 245 discloses a method for development-processing of presensitized plates for use in making lithographic printing plates which comprises imagewise exposing the presensitized plate to light and development-processing the exposed presensitized plate with an alkaline developer and a replenisher, wherein the developer and the replenisher are aqueous solutions of an alkali metal silicate and the ratio $(SiO_2)$:$(M_2O)$ (wherein $(SiO_2)$ and $(M_2O)$ are the molar concentrations of respectively $SiO_2$ and an alkali metal oxide $M_2O$) of the replenisher ranges from 0.6 to 1.5.

U.S. Pat. No. 5,466,557 discloses a radiation-sensitive composition comprising (1) a resole resin, (2) a novolac resin, (3) a latent Bronsted acid, (4) an infrared absorber, and (5) terephthalaldehyde.

GB-A-1 155 035 discloses a method of recording information, wherein a recording material is used comprising a layer of a polymeric material which when any given area of the layer is sufficiently heated undergoes in that area a modification resulting in a decrease in the solubility of that area of the layer in water or an aqueous medium, such layer also incorporating a substance or substances distributed over the whole area of the layer and being capable of being heated by exposing the layer to intense radiant energy which is absorbed by such substance or substances, and wherein the said material is exposed to intense radiant energy which is distributed over the material in a pattern determined by the information to be recorded and which is at least partly absorbed by said distributed substance or substances, so that a corresponding heat pattern is generated in the material, whereby such information is recorded in terms of a difference in the solubilities in water or an aqueous medium of different areas of said layer.

GB-A-1 154 568 discloses a method of recording a graphic original having contrasting light-absorbing and light-transmitting areas, wherein a recording material comprising a supported layer composed mainly of gelatin the water-solubility or water-absorptive capacity of which increases if the layer is sufficiently heated such layer also having light absorbing substance(s) distributed therein, is placed with such gelatin layer in contact with the light-absorbing areas of the original and the said gelatin layer is exposed to light through the original, the intensity of the light and the duration of the exposure being such that the areas of the gelatin layer in contact with the light-absorbing areas of the original are substantially unaffected by heat conduction from such light-absorbing areas, but the water-solubility or water-absorptive capacity of the other areas of the gelatin layer is increased by heating thereof due to absorption of copying light by the light-absorbing substance (s) in those other areas of the gelatin layer.

So, there is a need for a heat-mode imaging element which is easy to prepare and which undergoes little or no ablation during the IR-radiation.

OBJECTS OF THE INVENTION

It is an object of the invention to provide a method for making lithographic printing plates from heat mode imaging elements which are easy to prepare.

It is a further object of the invention to provide a method for making lithographic printing plates from a heat mode imaging element which undergoes little or no ablation during the IR-radiation.

It is an object of the invention to provide a method for making positive lithographic printing plates from a heat mode sensitive imaging element having excellent printing properties, developable in a selective, rapid convenient and ecological way.

It is further an object of the present invention to provide a method for making positive lithographic printing plates from a heat mode sensitive imaging element having a high infrared sensitivity.

It is also an object of the present invention to provide a method for making positive lithographic printing plates from a heat mode sensitive imaging element which can be imaged by laser exposure at short as well as at long pixel dwell times.

Further objects of the present invention will become clear from the description hereinafter.

SUMMARY OF THE INVENTION

According to the present invention there is provided a method for making lithographic printing plates including the following steps a) preparing a heat mode imaging element consisting of a lithographic base with a hydrophilic surface and a top layer which top layer is sensitive to IR-radiation, comprises a polymer, soluble in an aqueous alkaline solution and is unpenetrable for an alkaline developer containing $SiO_2$ as silicates;

b) exposing imagewise said heat mode imaging element to IR-radiation;

c) developing said imagewise exposed heat mode imaging element with said alkaline developer so that the exposed areas of the top layer are dissolved and the unexposed areas of the top layer remain undissolved characterized in that said top layer includes an IR-dye selected from the group consisting of indoaniline dyes, cyanine dyes, merocyanine dyes, oxonol dyes, porphine derivatives, anthraquinone dyes, merostyryl dyes, pyrylium compounds, diphenyl and triphenyl azo compounds and squarylium derivatives.

DETAILED DESCRIPTION OF THE INVENTION

It has been found that a heat-sensitive imaging element according to the invention can he obtained in an easy way by one coating, which yields a lithographic printing plate of high quality with little or no ablation in an ecologically acceptable way.

The IR-sensitive layer, in accordance with the present invention comprises an IR-dye and a polymer, soluble in an aqueous alkaline solution. A mixture of IR-dyes may be used, but it is preferred to use only one IR-dye. Suitable IR-dyes are known since a long time and belong to several different chemical classes, e.g. indoaniline dyes, oxonol dyes, porphine derivatives, anthraquinone dyes, merostyryl dyes, pyrylium compounds and sqarylium derivatives Preferably said IR-dyes, especially for irradiation with a laser source with an emission spectrum of about 1060 nm belongs to the scope of the general formula of the German patent application DE-4. 31 162. This general formula (I) is represented by:

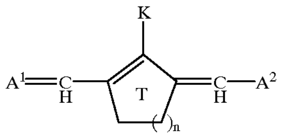

wherein K represents Q together with a counterion An—, or

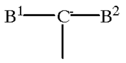

wherein

Q represents chlorine, fluorine, bromine, iodine, alkyloxy, aryloxy, dialkylamino, diarylamino, alkylarylamino, nitro, cyano, alkylsulphonyl, arylsulphonyl, heterocyclyl, or a moiety represented by L—S—, wherein L represents alkyl, aryl, heterocyclyl, cyano or substituted carbonyl, thiocarbonyl or iminocarbonyl, An— represents an anion commonly used in the chemistry of cationic dyes, or an equivalent thereof, $B^1$ represents cyano, alkoxycarbonyl, alkyl- or arylcarbonyl, or aminocarbonyl optionally substituted once or twice at the nitrogen atom by alkyl and/or aryl, $B^2$ represents arylsulphonyl, alkylsulphonyl, heteroaryl, or,

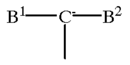

can be represented by

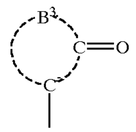

wherein $B^3$ represents the non-metal atoms to complete a carbocyclic or heterocyclic ring, ring T can be substituted by 1 to 3 $C_1$–$C_4$ alkyl groups, n=1 or 2, and $A^1$ and $A^2$ can represent following combinations:

(1) moieties of formulas (IIIa) and (IIIb):

(IIIa)

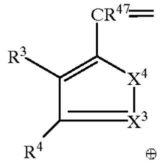

(IIIb)

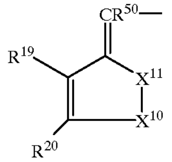

wherein $X^3$, $X^{10}$=0, $X^4$, $X^{11}$=—$CR^{38}$=—$CR^{39}$, $R^{38}$ and $R^{39}$ each independently represent hydrogen, alkyl, aryl or together the necessary non-metal atoms to complete a cycloaliphatic, aromatic or heterocyclic 5- or 7-membered ring, or independently from each other, the necessary non-metal atoms to complete a cycloaliphatic, aromatic or heterocyclic 5- or 7-membered ring, and $R^3$, $R^4{}_1$, $R^{19}$ and $R^{20}$ each independently represent hydrogen, $C_1$–$C_8$ alkyl, aryl, halogen, cyano, alkoxycarbonyl, optionally substituted aminocarbonyl, amino, monoalkylamino, dialkylamino, hydroxy, alkoxy, aryloxy, alkylthio, arylthio, acyloxy, acylamino, arylamino, alkylcarbonyl, arylcarbonyl, or the necessary non-metal atoms to complete a cycloaliphatic, aromatic or heterocyclic 5- or 7-membered ring, $R^{47}$ and $R^{50}$ each independently represent hydrogen, alkyl, aryl, cyano, alkoxycyano or the non-metal atoms to form a saturated or unsaturated 5- to 7-membered ring, in the first case between $R^{47}$ and resp. $X^4$ and $R^3$, in the second case between $R^{50}$ and resp. $X^{11}$ and $R^{19}$.

(2) moieties of the same formulas (IIIa) and (IIIb)

wherein $X^3$, $X^{10}$=$R^{44}$N, $X^4$, $X^{11}$=—$CR^{38}$=—$CR^{39}$, and wherein $R^3$ and $R^4$, respectively $R^{38}$ and $R^{39}$ together represent the atoms to complete an optionally substituted aromatic ring, and wherein $R^{44}$ represents optionally substituted alkyl or aryl, or the necessary atoms to complete a 5- or 7- membered ring, (3) moieties of the formulas (IVa) and (IVb):

(IVa)

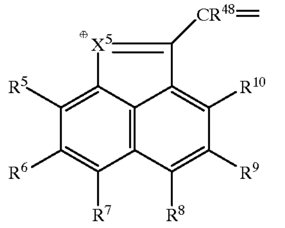

(IVb)

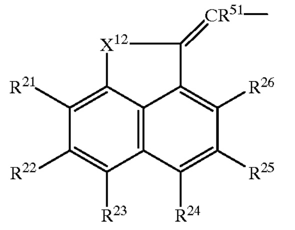

wherein $X^5$ and $X^{12}$ each independently represent O, S, Se, Te or $R^{44}N$, $R^5$ to $R^{10}$ and $R^{21}$ to $R^{26}$ each independently represent one of the meanings given above for $R^3$, and $R^{48}$ and $R^{51}$ each independently represent hydrogen, alkyl, aryl or alkoxycarbonyl, with the exception for those compounds in which together $X^5$, $X^{12}$=$R^{44}N$ and Q=halogen, (4) moieties of formulas (VIIa) and (VIIb)

(VIIa)

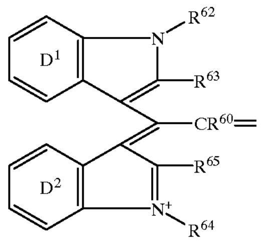

(VIIb)

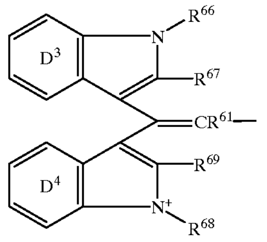

wherein $R^{60}$ and $R^{61}$ each independently represent hydrogen, alkyl, aryl, cyano, alkoxycarbonyl, halogen, $R^{62}$, $R^{64}$, $R^{66}{}_1$, $R^{68}$ each independently represent alkyl or aryl, $R^{63}{}_1$, $R^{65}$, $R^{67}$, $R^{69}$ each independently represent hydrogen, alkyl or aryl, and wherein the rings $D^1$ to $D^4$ each independently can be substituted once or frequently by hydrogen, chlorine, bromine, alkyl, or alkoxy.

Most preferred subclasses of this general formula (I) are the following:

compounds according to formula (XXI)

(XXI)

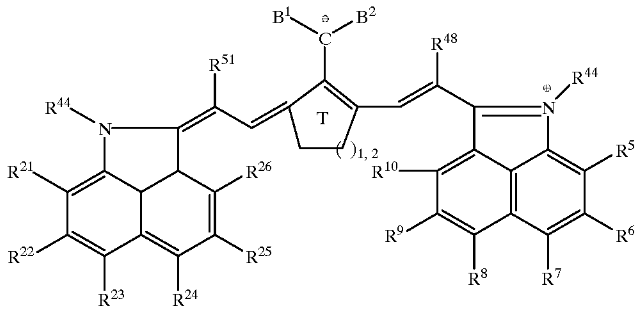

compounds according to formula (XXIII):

(XXIII)

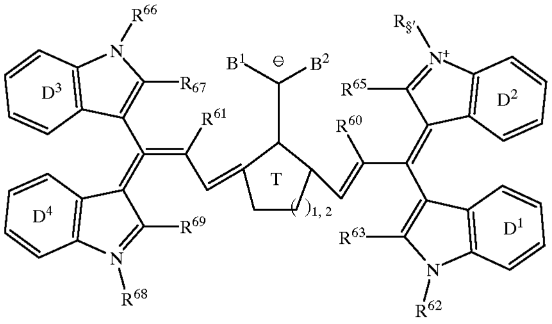

compounds according to formula (XXV):

(XXV)

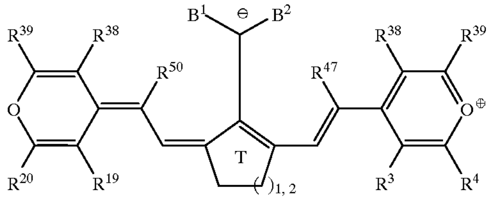

compounds according to formula (XXVII)

(XXVII)

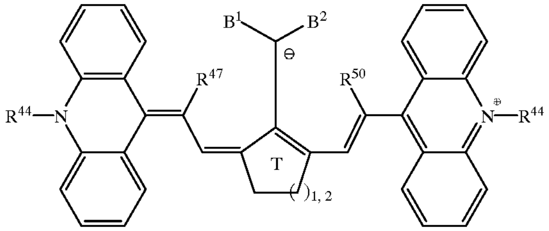

compounds according to formula (XXIX):

(XXIX)

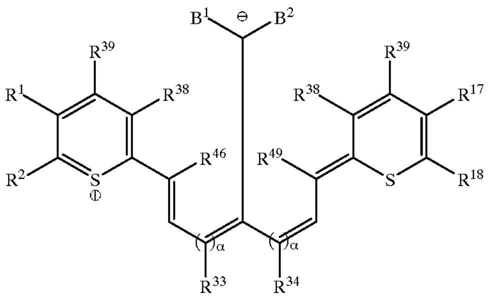

In the formulas of these subclasses R1, R2, R17 and R18 have the same meaning as R3, and B1, B2, the other R symbols, T, and the D symbols are defined as hereinbefore, and α is 0 or 1.

Some specific infra-red absorbing dyes (IRD) corresponding to general formula (I) or to one of the preferred subclasses defined above which are chosen for the determination of specific spectral characteristics are listed below. A reference number is designated to them by which they will be identified in the tables furtheron of the description and examples:

IRD No. 1

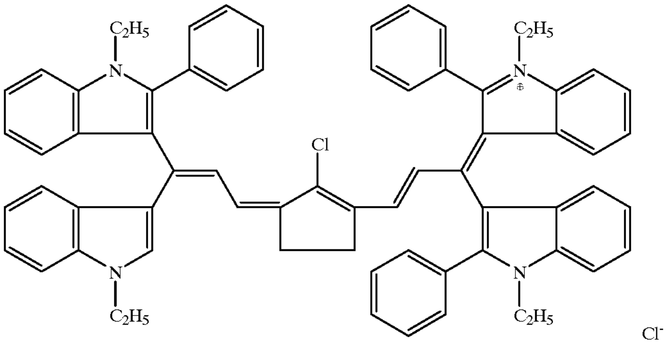

-continued
IRD No. 2
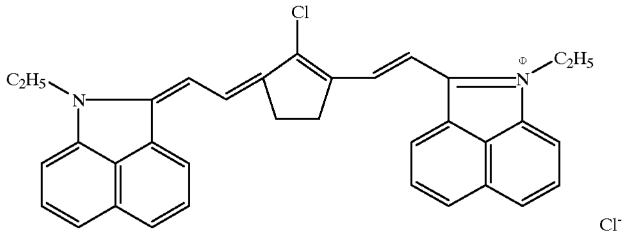
IRD No. 3
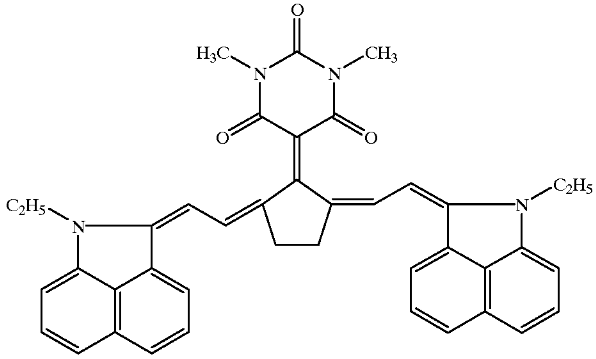
IRD No. 4
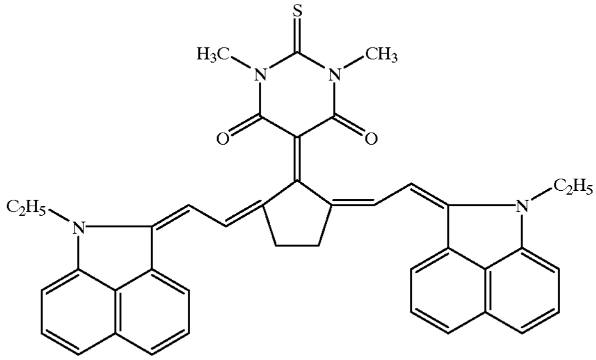
IRD No. 5
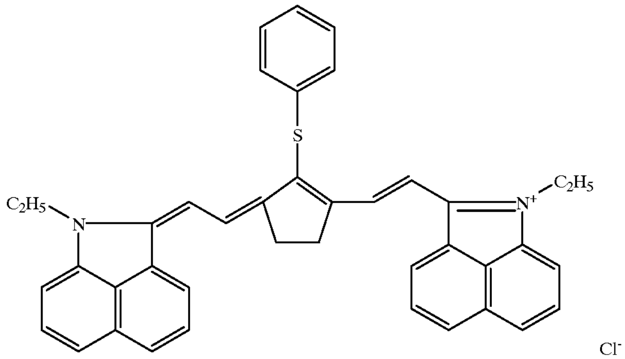
IRD No. 6
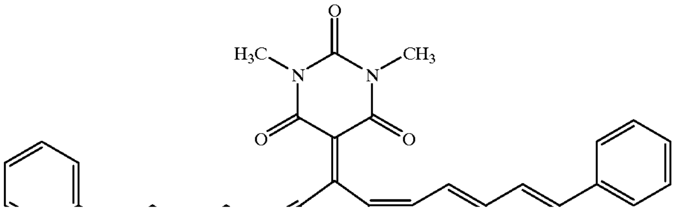

Further suitable prior art dyes included in the experimental investigation of spectral parameters are represented by following formulas:

IRD-14 is a commercial product known as CYASORB IR165, marketed by American Cyanamid Co, Glendale Protective Technologie Division, Woodbury, N.Y. It is a mixture of two parts of the molecular non-ionic form (IRD-14a) and three parts of the ionic form (IRD-14b) represented by:

IRD No. 14a

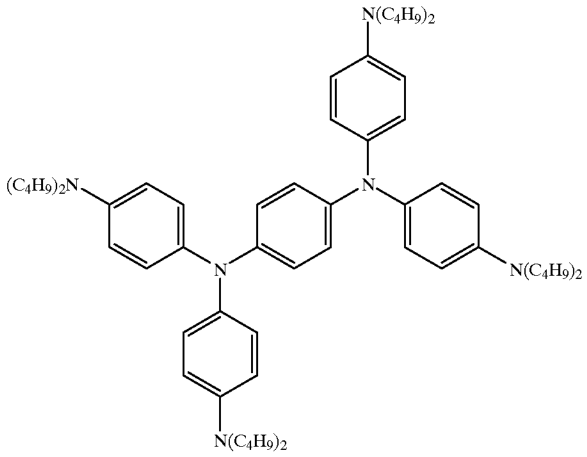

IRD No. 14b

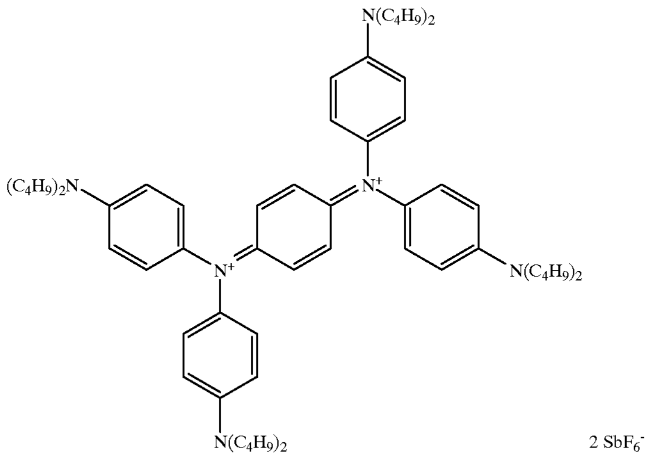

IRD No. 15

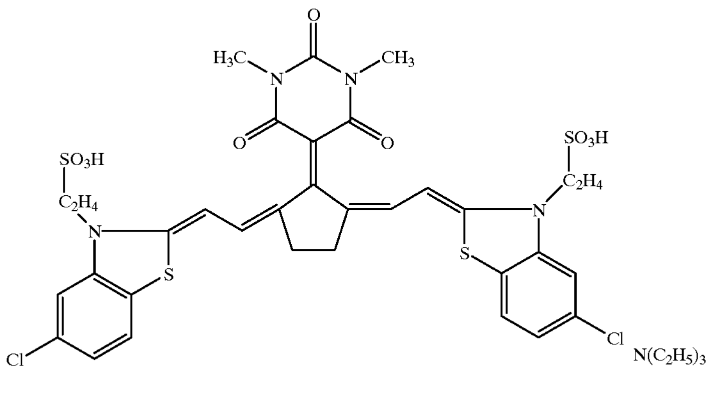

-continued

IRD No. 16

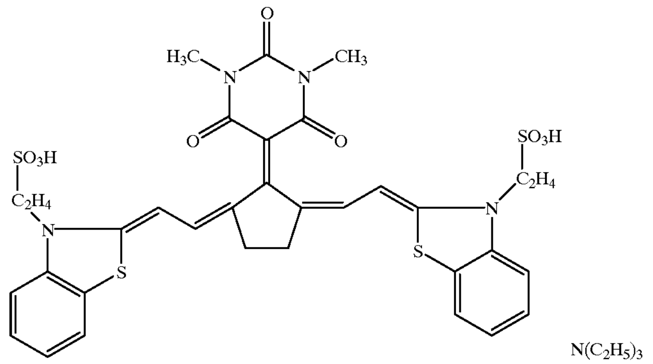

IRD No. 17

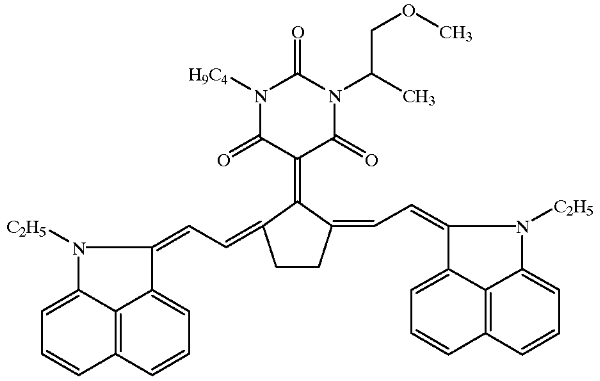

Other preferred IR-dyes, especially for irradiation with a laser source with an emission spectrum of about 830 nm belong to the scope of the following general formulas.

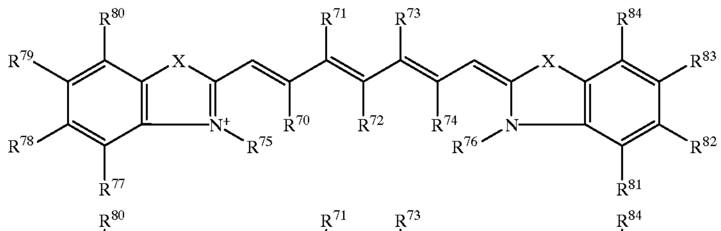

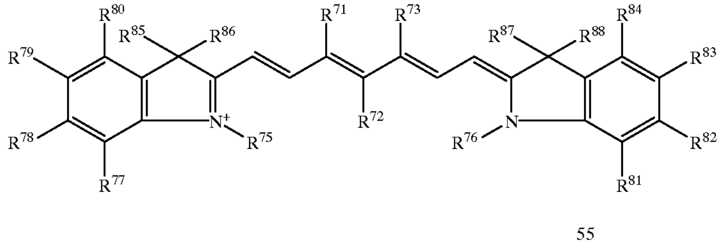

wherein

X, X' each independently represents O, S $R^{70}$–$R^{74}$ each independently may represent hydrogen, alkyl or aryl;

$R^{70}$ together with $R^{72}$, $R^{72}$ together with $R^{74}$, $R^{71}$ together with $R^{73}$, $R^{70}$ together with $R^{72}$ and $R^{74}$ may form a carbocyclic ring $R^{72}$ may also represent halogen, $NR^{88}R^{89}$ ($R^{88}$,$R^{89}$ each independently represents alkyl, aryl, or may form a (hetero)cyclic ring), $PR^{88}R^{89}$, ester-$COOR^{92}$ ($R^{92}$ represents alkyl, or aryl), barbituric acid group (with optionally substituted N-atoms)

$R^{71}$ or $R^{73}$ may represents: —$OCOR^{93}$; $R^{93}$ represents alkyl, or aryl.

$R^{77}$ together with $R^{78}$, R78 together with $R^{79}$, $R^{79}$ together with $R^{80}$, $R^{81}$ together with $R^{82}$, $R^{82}$ together with $R^{83}$, $R^{83}$ together with $R^{84}$ may form an annulated benzoring optionally substituted with a carbocyclic acid, ester or sulpho group.

$R^{78}$, $R^{79}$, $R^{82}$, $R^{83}$ each independently may represent hydrogen, alkyl, aryl, halogen, ester, carbocyclic acid, amide, amine, nitrile, alkoxy, aryloxy, or sulpho group.

$R^{85}$, $R^{86}$, $R^{87}$, $R^{88}$ each independently may represent an alkyl group, $R^{85}$ together with $R^{86}$, $R^{87}$ together with $R^{88}$ may form a cyclic (spiro) ring.

$R^{75}$, $R^{76}$ each independently represents an alkyl, aryl group; —$C_nH_{2n}SO_3M$ (n represents an integer from 2 to 4 and M H or positively charged counterion); —$C_nH_{2n}COOM$ (n represents an integer from 1 to 5 and M H or positively charged counterion); —$C_nH_{2n}COOR^{94}$ (n represents an integer from 1 to 5 and $R^{94}$ alkyl, or aryl group); —L1-$CONHSO_2R^{95}$ (L1 represents —$C_nH_{2n}$— with n an integer from 1 to 4 and $R^{95}$ alkyl or aryl).

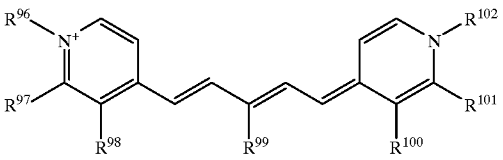

$R^{96}$, $R^{102}$ represents alkyl, or aryl group; —$C_nH_{2n}SO_3M$ (n represents an integer from 2 to 4 and M H or positively charged counterion); —$C_nH_{2n}COOM$ (n represents an integer from 1 to 5 and M H or positively charged counterion); —$C_nH_{2n}COOR^{103}$ (n represents an integer from 1 to 5 and $R^{103}$ alkyl, or aryl group); —L1-$CONHSO_2R^{104}$ (L1 represents —$C_nH_{2n}$— with n an integer from 1 to 4 and $R^{104}$ alkyl or aryl).

$R^{97}$, $R^{98}$ $R^{100}$, $R^{101}$ may each independently represent: hydrogen, alkyl, aryl; $R^{97}$ together with $R^{98}$, $R^{100}$ together with $R^{101}$ may form an annulated benzoring.

$R^{98}$ may represent: hydrogen, alkyl, aryl, halogen, ester, or —SO2$R^{105}$ ($R^{105}$ represents an alkyl or aryl).

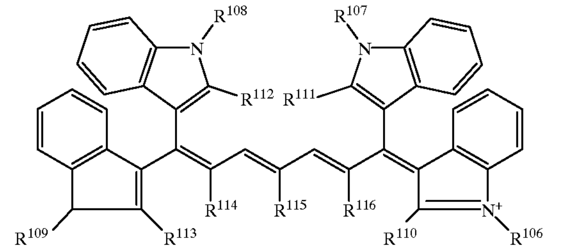

$R^{106}$, $R^{107}$, $R^{108}$, $R^{109}$ each independently may represent alkyl, aryl group; —$C_nH_{2n}SO_3M$ represents an integer from 2 to 4 and M H or positively charged counterion); —$C_nH_{2n}COOM$ (n represents an integer from 1 to 5 and M H or positively charged counterion); —$C_nH_{2n}COOR^{117}$ (n represents an integer from 1 to 5 and $R^{117}$ alkyl, or aryl group);

—L1-$CONHSO_2R^{118}$ (L1 represents —$C_nH_{2n}$— with n an integer from 1 to 4 and $R^{118}$ alkyl or aryl).

$R^{110}$, $R^{111}$, $R^{112}$, $R^{113}$ each independently represents: hydrogen, alkyl, or aryl group.

$R^{114}$, $R^{115}$, $R^{116}$ each independently may represent: hydrogen, alkyl, or aryl group; $R^{115}$ represents halogen, ester, or —SO2$R^{119}$ ($R^{119}$ represents alkyl, or aryl).

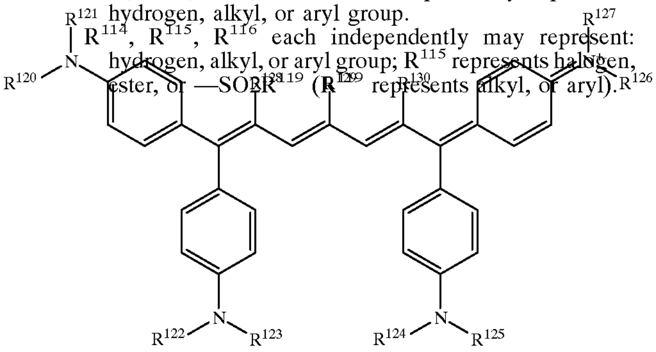

$R^{120}$, $R^{121}$, $R^{122}$, $R^{123}$ $R^{124}$, $R^{125}$, $R^{126}$, $R^{127}$: each independently may represent alkyl, aryl group; —$C_nH_{2n}SO_3M$ (n represents an integer from 2 to 4 and M H or positively charged counterion); —$C_nH_{2n}COOM$ (n represents an integer from 1 to 5 and M H or positively charged counterion); —$C_nH_{2n}COOR^{131}$ (n represents an integer from 1 to 5 and $R^{131}$ alkyl, or aryl group); —L1-$CONHSO_2R^{132}$ (L1 represents —$C_nH_{2n}$— with n an integer from 1 to 4 and $R^{132}$ alkyl or aryl).

$R^{120}$ together with $R^{121}$, $R^{122}$ together with $R^{123}$, $R^{124}$ together with $R^{125}$, $R^{126}$ together with $R^{127}$ may form a cyclic ring.

$R^{128}$, $R^{129}$, $R^{130}$: each independently may represents hydrogen, alkyl, or aryl group; $R^{129}$ may represent: halogen, ester, or —SO2$R^{133}$ ($R^{133}$ represents alkyl, or aryl).

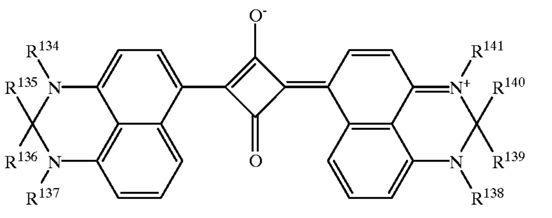

$R^{134}$, $R^{137}$, $R^{138}$, $R^{141}$ each independently may represent: hydrogen, alkyl, or aryl $R^{134}$ together with $R^{135}$, $R^{141}$ together with $R^{140}$ may form a carbocyclic ring.

$R^{135}$ together with $R^{136}$, $R^{139}$ together with $R^{140}$ may form a carbocyclic ring.

$R^{135}$, $R^{136}$, $R^{139}{}_1$, $R^{140}$ each independently may represent: hydrogen, alkyl, aryl group; —$C_nH_{2n}SO_3M$ (n represents an integer from 2 to 4 and M H or positively charged counterion); —$C_nH_{2n}COOM$ (n represents an integer from 1 to 5 and M H or positively charged counterion);

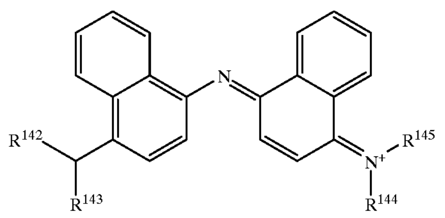

$R^{142}$, $R^{143}$, $R^{144}$, $R^{145}$ each independently represents alkyl, aryl group; —$C_nH_{2n}SO_3M$ represents an integer from 2 to 4 and M H or positively charged counterion); —$C_nH_{2n}COOM$ (n represents an integer from 1 to 5 and M H or positively charged counterion); —$C_nH_{2n}COOR^{146}$ (n represents an integer from 1 to 5 and $R^{146}$ alkyl, or aryl group); —L1-$CONHSO_2R^{147}$ (L1 represents —$C_nH_{2n}$— with n an integer from 1 to 4 and $R^{147}$ alkyl or aryl).

R142 together with R143, R144 together with R145 may form a cyclic ring.

The charge of the dyes can be compensated by any (intermolecular or intramolecular) counterion.

The IR-dyes are present preferably in an amount between 1 and 60 parts, more preferably between 3 and 50 parts by weight of the total amount of said IR-sensitive top layer.

The alkali soluble polymers used in this layer are preferably hydrophobic and ink accepting polymers as used in conventional positive or negative working PS-plates e.g. carboxy substituted polymers etc. More preferably is a phenolic resin such as polyvinylfenol or a novolac polymer. Most preferred is a novolac polymer. Typical examples of these polymers are described in DE-A-4 007 428, DE-A-4 027 301 and DE-A-4 445 820. The hydrophobic polymer used in connection with the present invention is further characterised by insolubility in water and at least partial solubility/swellability in an alkaline solution and/or at least partial solubility in water when combined with a cosolvent.

Furthermore this IR-sensitive layer is preferably a visible light- and UV-light desensitised layer. Still further said layer is preferably thermally hardenable. This preferably visible light- or UV-light desensitised layer does not comprise photosensitive ingredients such as diazo compounds, photoacids, photoinitiators, quinone diazides, sensitisers etc. which absorb in the wavelength range of 250 nm to 650 nm. In this way a daylight stable printing plate can be obtained.

Said IR-sensitive layer preferably also includes a low molecular acid, more preferably a carboxylic acid, still more preferably a benzoic acid, most preferably 3,4,5-trimethoxybenzoic acid or a benzophenone, more preferably trihydroxybenzophenone.

The ratio between the total amount of low molecular acid or benzophenone and polymer in the IR-sensitive layer preferably ranges from 2:98 to 40:60, more preferably from 5:95 to 30:70. The total amount of said IR-sensitive layer preferably ranges from 0.1 to 10 $g/m^2$, more preferably from 0.3 to 2 $g/m^2$.

In the IR-sensitive layer a difference in the capacity of being penetrated and/or solubilised by the alkaline developer containing $SiO_2$ and $M_2O$ in a molar ratio of 0.5 to 1.5 and a concentration of $SiO_2$ of 0.5 to 5% by weight is generated upon image-wise exposure for an alkaline developer according to the invention.

In the imaging element according to the present invention, the lithographic base can be an anodised aluminum. A particularly preferred lithographic base is an electrochemically grained and anodised aluminum support. The anodised aluminum support may be treated to improve the hydrophilic properties of its surface. For example, the aluminum support may be silicated by treating its surface with sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or can be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, and acetals of polyvinyl alcohols formed by reaction with a sulphonated aliphatic aldehyde. It is further evident that one or more of these post treatments may be carried out alone or in combination. More detailed descriptions of these treatments are given in GB-A-1 084 070, DE-A-4 423 140, DE-A-4 417 907, EP-A-659 909, EP-A-537 633, DE-A-4 001 466, EP-A-292 801, EP-A-291 760 and U.S. Pat. No. 4,458,005.

According to another embodiment in connection with the present invention, the lithographic base having a hydrophilic surface comprises a flexible support, such as e.g. paper or plastic film, provided with a cross-linked hydrophilic layer. A particularly suitable cross-linked hydrophilic layer may be obtained from a hydrophilic binder cross-linked with a cross-linking agent such as formaldehyde, glyoxal, polyisocyanate or a hydrolysed tetraalkylorthosilicate. The latter is particularly preferred.

As hydrophilic binder there may be used hydrophilic (co)polymers such as for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight.

The amount of crosslinking agent, in particular of tetraalkyl orthosilicate, is preferably at least 0.2 parts by weight per part by weight of hydrophilic binder, more preferably between 0.5 and 5 parts by weight, most preferably between 1.0 parts by weight and 3 parts by weight.

A cross-linked hydrophilic layer in a lithographic base used in accordance with the present embodiment preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stöber as described in J.

Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the cross-linked hydrophilic layer is given a uniform rough texture consisting of microscopic hills and valleys, which serve as storage places for water in background areas.

The thickness of a cross-linked hydrophilic layer in a lithographic base in accordance with this embodiment may vary in the range of 0.2 to 25 $\mu$m and is preferably 1 to 10 $\mu$m.

Particular examples of suitable cross-linked hydrophilic layers for use in accordance with the present invention are disclosed in EP-A-601 240, GB-P-1 419 512, FR-P-2 300 354, U.S. Pat. No. 3,971,660, U.S. Pat. No. 4,284,705 and EP-A-514 490.

As flexible support of a lithographic base in connection with the present embodiment it is particularly preferred to use a plastic film e.g. substrated polyethylene terephthalate film, cellulose acetate film, polystyrene film, polycarbonate film etc . . . . The plastic film support may be opaque or transparent.

It is particularly preferred to use a polyester film support to which an adhesion improving layer has been provided. Particularly suitable adhesion improving layers for use in accordance with the present invention comprise a hydrophilic binder and colloidal silica as disclosed in EP-A-619 524, EP-A-620 502 and EP-A-619 525. Preferably, the amount of silica in the adhesion improving layer is between 200 mg per $m^2$ and 750 mg per $m^2$. Further, the ratio of silica to hydrophilic binder is preferably more than 1 and the surface area of the colloidal silica is preferably at least 300 $m^2$ per gram, more preferably at least 500 m2 per gram.

Image-wise exposure in connection with the present invention is an image-wise scanning exposure involving the use of a laser that operates in the infrared or near-infrared, i.e. wavelength range of 700–1500 nm. Most preferred are laser diodes emitting in the near-infrared. Exposure of the imaging element can be performed with lasers with a short as well as with lasers with a long pixel dwell time. Preferred are lasers with a pixel dwell time between 0.005 $\mu$s and 20 $\mu$s.

After the image-wise exposure the heat mode imaging element is developed by rinsing it with an aqueous alkaline solution. The aqueous alkaline solutions used in the present invention are those that are used for developing conventional positive working presensitised printing plates and have preferably a pH between 11.5 and 14. Thus the imaged parts of the top layer that were rendered more penetrable for the aqueous alkaline solution upon exposure are cleaned-out whereby a positive working printing plate is obtained.

In the present invention, the composition of the developer used is also very important.

Therefore, to perform development processing stably for a long time period particularly important are qualities such as strength of alkali and the concentration of silicates in the developer. Under such circumstances, the present inventors have found that a rapid high temperature processing can be performed, that the amount of the replenisher to be supplemented is low and that a stable development processing can be performed over a long time period of the order of not less than 3 months without exchanging the developer only when the developer having the foregoing composition is used.

The developers and replenishers for developer used in the invention are preferably aqueous solutions mainly composed of alkali metal silicates and alkali metal hydroxides represented by MOH or their oxyde, represented by $M_2O$, wherein said developer comprises $SiO_2$ and $M_2O$ in a molar ratio of 0.5 to 1.5. As such alkali metal silicates, preferably used are, for instance, sodium silicate, potassium silicate, lithium silicate and sodium metasilicate. On the other hand, as such alkali metal hydroxides, preferred are sodium hydroxide, potassium hydroxide and lithium hydroxide.

The developers used in the invention may simultaneously contain other alkaline agents. Examples of such other alkaline agents include such inorganic alkaline agents as ammonium hydroxide, sodium tertiary phosphate, sodium secondary phosphate, potassium tertiary phosphate, potassium secondary phosphate, ammonium tertiary phosphate, ammonium secondary phosphate, sodium bicarbonate, sodium carbonate, potassium carbonate and ammonium carbonate; and such organic alkaline agents as mono-, di- or triethanolamine, mono-, di- or trimethylamine, mono-, di- or triethylamine, mono- or di- isopropylamine, n-butylamine, mono-, di- or triisopropanolamine, ethyleneimine, ethylenediimine and tetramethylammonium hydroxide.

In the present invention, particularly important is the molar ratio in the developer of $[SiO_2]/[M_2O]$, which is generally 0.6 to 1.5, preferably 0.7 to 1.3. This is because if the molar ratio is less than 0.6, great scattering of activity is observed, while if it exceeds 1.5, it becomes difficult to perform rapid development and the dissolving out or removal of the light-sensitive layer on non-image areas is liable to be incomplete. In addition, the concentration of $SiO_2$ in the developer and replenisher preferably ranges from 1 to 4 % by weight. Such limitation of the concentration of $SiO_2$ makes it possible to stably provide lithographic printing plates having good finishing qualities even when a large amount of plates according to the invention are processed for a long time period.

In a particular preferred embodiment, an aqueous solution of an alkali metal silicate having a molar ratio $[SiO_2]/[M_2O]$, which ranges from 1.0 to 1.5 and a concentration of $SiO_2$ of 1 to 4% by weight is used as a developer. In such case, it is a matter of course that a replenisher having alkali strength equal to or more than that of the developer is employed. In order to decrease the amount of the replenisher to be supplied, it is advantageous that a molar ratio, $[SiO_2]/[M_2O]$, of the replenisher is equal to or smaller than that of the developer, or that a concentration of $SiO_2$ is high if the molar ratio of the developer is equal to that of the replenisher.

In the developers and the replenishers used in the invention, it is possible to simultaneously use organic solvents having solubility in water at 20° C. of not more than 10% by weight according to need. Examples of such organic solvents are such carboxilic acid esters as ethyl acetate, propyl acetate, butyl acetate, amyl acetate, benzyl acetate, ethylene glycol monobutyl acetate, butyl lactate and butyl levulinate; such ketones as ethyl butyl ketone, methyl isobutyl ketone and cyclohexanone; such alcohols as ethylene glycol monobutyl ether, ethylene glycol benzyl ether, ethylene glycol monophenyl ether, benzyl alcohol, methylphenylcarbinol, n-amyl alcohol and methylamyl alcohol; such alkyl-substituted aromatic hydrocarbons as xylene; and such halogenated hydrocarbons as methylene dichloride and monochlorobenzene. These organic solvents may be used alone or in combination. Particularly preferred is benzyl alcohol in the invention. These organic solvents are added to the developer or replenisher therefor generally in an amount of not more than 5% by weight and preferably not more than 4% by weight.

The developers and replenishers used in the present invention may simultaneously contain a surfactant for the purpose of improving developing properties thereof. Examples of such surfactants include salts of higher alcohol (C8~C22) sulfuric acid esters such as sodium salt of lauryl alcohol sulfate, sodium salt of octyl alcohol sulfate, ammonium salt of lauryl alcohol sulfate, Teepol B-81 (trade mark, available from Shell Chemicals Co., Ltd.) and disodium alkyl sulfates; salts of aliphatic alcohol phosphoric acid esters such as sodium salt of cetyl alcohol phosphate; alkyl aryl sulfonic acid salts such as sodium salt of dodecylbenzene sulfonate, sodium salt of isopropylnaphthalene sulfonate,sodium salt of dinaphthalene disulfonate and sodium salt of metanitrobenzene sulfonate; sulfonic acid salts of alkylamides such as $C_{17}H_{33}CON(CH_3)CH_2CH_2SO_3Na$ and sulfonic acid salts of dibasic aliphatic acid esters such as sodium dioctyl sulfosuccinate and sodium dihexyl sulfosuccinate. These surfactants may be used alone or in combination. Particularly preferred are sulfonic acid salts. These surfactants may be used in an amount of generally not more than 5% by weight and preferably not more than 3% by weight.

In order to enhance developing stability of the developers and replenishers used in the invention, the following compounds may simultaneously be used.

Examples of such compounds are neutral salts such as NaCl, KCl and KBr as disclosed in JN-A-58-75 152; chelating agents such as EDTA and NTA as disclosed in JN-A-58-190 952 (U.S. Pat. No. 4,469,776), complexes such as [Co(NH3)6]C13 as disclosed in JN-A-59-121 336 (U.S. Pat. No. 4,606,995); ionizable compounds of elements of the group IIa, IIIa or IIIb of the Periodic Table such as those disclosed in JN-A-55-25 100; anionic or amphoteric surfactants such as sodium alkyl naphthalene sulfonate and N-tetradecyl-N,N-dihydroxythyl betaine as disclosed in JN-A-50-51 324; tetramethyldecyne diol as disclosed in U.S. Pat. No. 4,374,920; non-ionic surfactants as disclosed in JN-A-60-213 943; cationic polymers such as methyl chloride quaternary products of p-dimethylaminomethyl polystyrene as disclosed in JN-A-55-95 946; amphoteric polyelectrolytes such as copolymer of vinylbenzyl trimethylammonium chloride and sodium acrylate as disclosed in JN-A-56-142 528; reducing inorganic salts such as sodium sulfite as disclosed in JN-A-57-192 952 (U.S. Pat. No. 4,467,027) and alkaline-soluble mercapto compounds or thioether compounds such as thiosalicylic acid, cysteine and thioglycolic acid; inorganic lithium compounds such as lithium chloride as disclosed in JN-A-58-59 444; organic lithium compounds such as lithium benzoate as disclosed in JN-A-50 34 442; organometallic surfactants containing Si, Ti or the like as disclosed in JN-A-59-75 255; organoboron compounds as disclosed in JN-A-59-84 241 (U.S. Pat. No. 4,500,625); quaternary ammonium salts such as tetraalkylammonium oxides as disclosed in EP-A-101 010; and bactericides such as sodium dehydroacetate as disclosed in JN-A-63-226 657.

In the method for development processing of the present invention, any known means of supplementing a replenisher for developer may be employed. Examples of such methods preferably used are a method for intermittently or continuously supplementing a replenisher as a function of the amount of PS plates processed and time as disclosed in JN-A-55-115 039 (GB-A-2 046 931), a method comprising disposing a sensor for detecting the degree of light-sensitive layer dissolved out in the middle portion of a developing zone and supplementing the replenisher in proportion to the detected degree of the light-sensitive layer dissolved out as disclosed in JN-A-58-95 349 (U.S. Pat. No. 4,537,496); a method comprising determining the impedance value of a developer and processing the detected impedance value by a computer to perform supplementation of a replenisher as disclosed in GB-A-2 208 249.

The printing plate of the present invention can also be used in the printing process as a seamless sleeve printing plate. In this option the printing plate is soldered in a cylindrical form by means of a laser. This cylindrical printing plate which has as diameter the diameter of the print cylinder is slided on the print cylinder instead of applying in a classical way a classically formed printing plate. More details on sleeves are given in "Grafisch Nieuws" ed. Keesing, 15, 1995, page 4 to 6.

After the development of an image-wise exposed imaging element with an aqueous alkaline solution and drying, the obtained plate can be used as a printing plate as such. However, to improve durability it is still possible to bake said plate at a temperature between 200° C. and 300° C. for a period of 30 seconds to 5 minutes. Also the imaging element can be subjected to an overall post-exposure to UV-radiation to harden the image in order to increase the run length of the printing plate.

The following examples illustrate the present invention without limiting it thereto. All parts and percentages are by weight unless otherwise specified.

EXAMPLES

Example 1

Positive Working Thermal Plate Based on an Alkali-Soluble Binder

Preparation of the Lithographic Base

A 0.20 mm thick aluminum foil was degreased by immersing the foil in an aqueous solution containing 5 g/l of sodium hydroxide at 50° C. and rinsed with demineralized water. The foil was then electrochemically grained using an alternating current in an aqueous solution containing 4 g/l of hydrochloric acid, 4 g/l of hydroboric acid and 5 g/l of aluminum ions at a temperature of 35° C. and a current density of 1200 $A/m^2$ to form a surface topography with an average center-line roughness Ra of 0.5 mm.

After rinsing with demineralized water the aluminum foil was then etched with an aqueous solution containing 300 g/l of sulfuric acid at 60° C. for 180 seconds and rinsed with demineralized water at 25° C. for 30 seconds.

The foil was subsequently subjected to anodic oxidation in an aqueous solution containing 200 g/l of sulfuric acid at a temperature of 45° C., a voltage of about 10 V and a current density of 150 $A/m^2$ for about 300 seconds to form an anodic oxidation film of 3.00 $g/m^2$ of $Al_2O_3$ then washed with demineralized water, posttreated with a solution containing polyvinylphosphonic acid and then with a solution containing aluminum trichloride, subsequently rinsed with demineralized water at 20° C. during 120 seconds and dried.

Preparation of the IR-sensitive Layer

The IR-sensitive layer was coated from a 4.65% wt solution in tetrahydrofuran/methoxypropanol 60/40 at a wet thickness of 30 $\mu$m.

The resulting IR-sensitive layer contained 10% of IR-dye compound I and 90% of ALNOVOL PN430™.

This material was imaged with a GERBER C42T™ internal drum platesetter at 12,000 rpm and 2540 dpi. The power level of the laser in the image plane was 4 W. After IR-exposure no layer damage, as a result of ablation, could be observed.

After exposure the material was developed in an alkaline developing solution (EP 240 developer commercially available from Agfa), dissolving very rapidly the IR-exposed areas, resulting in a positive working plate.

The plate was printed on a Heidelberg GTO46 printing machine with a conventional ink (K+E) and fountain solution (Rotamatic), resulting in good prints, i.e. no scumming in IR-exposed areas and good ink-uptake in the non-exposed areas.

Example 2

Positive Working Thermal Plate Based on an Alkali-Soluble Binder

The lithographic base was prepared as described in example 1.

The IR-sensitive layer was coated from a 4.65% wt solution in tetrahydrofuran/methoxypropanol 60/40 at a wet thickness of 30 $\mu$m.

The resulting IR-sensitive layer contained 4.7% of IR-dye compound II, 78.1% of ALNOVOL PN430™ and 17.2% of trihydroxybenzophenone. This material was imaged with a GERBER C42T™ internal drum platesetter at 12,000 rpm and 2540 dpi. The power level of the laser in the image plane was 4 W. After IR-exposure no layer damage, as a result of ablation, could be observed.

After exposure the material was developed in an alkaline developing solution (EP 26 developer commercially available from Agfa), dissolving very rapidly the IR-exposed areas, resulting in a positive working plate.

The plate was printed on a Heidelberg GTO46 printing machine with a conventional ink (K+E) and fountain solution (Rotamatic), resulting in good prints, i.e. no scumming in IR-exposed areas and good ink-uptake in the non-exposed areas.

Example 3

Positive Working Thermal Plate Based on an Alkali-soluble Binder

The lithographic base was prepared as described in example 1.

The IR-sensitive layer was coated from a 4.65% wt solution in tetrahydrofuran/methoxypropanol 60/40 at a wet thickness of 30 $\mu$m. The resulting IR-sensitive layer contained 9.1% of IR-dye compound II, 74.5% of ALNOVOL PN430™ and 16.4% of trihydroxybenzophenone.

This material was imaged with a GERBER C42T™ internal drum platesetter at 12,000 rpm and 2540 dpi. The power level of the laser in the image plane was 4 W. After IR-exposure no layer damage, as a result of ablation, could be observed.

After exposure the material was developed in an alkaline developing solution (EP 26 developer commercially available from Agfa), dissolving very rapidly the IR-exposed areas, resulting in a positive working plate.

The plate was printed on a Heidelberg GTO46 printing machine with a conventional ink (K+E) and fountain solution (Rotamatic), resulting in good prints, i.e. no scumming in IR-exposed areas and good ink-uptake in the non-exposed areas.

We claim:

1. A method for making lithographic printing plates including the following steps a) preparing a heat mode imaging element consisting of a lithographic base with a hydrophilic surface and a top layer which top layer is sensitive to IR-radiation, comprises a polymer, soluble in an aqueous alkaline solution, an IR-dye selected from the group consisting of indoaniline dyes, cyanine dyes, merocyanine dyes, oxonol dyes, porphine derivatives, anthraquinone dyes, merostyryl dyes, pyrylium compounds, diphenyl and triphenyl azo compounds and squarylium derivatives, and is unpenetrable for an alkaline developer containing $SiO_2$ and alkali metal hydroxides represented by MOH or oxides thereof represented by $M_2O$ in a molar ratio of a 0.5 to 1.5 and a concentration of $SiO_2$ of 0.5 to 5% by weight;

b) exposing imagewise said heat mode imaging element to IR-radiation;

c) developing said imagewise exposed heat mode imaging element with said alkaline developer so that the exposed areas of the top layer are dissolved and the unexposed areas of the top layer remain undissolved characterized in that said IR-sensitive layer is a visible light- and UV light-desensitized layer.

2. A method for making lithographic printing plates according to claim 1 wherein said polymer included in the IR-sensitive layer is a hydrophobic polymer.

3. A method for making lithographic printing plates according to claim 2 wherein said polymer is a phenolic resin.

4. A method for making lithographic printing plates according to claim 1 wherein said IR-sensitive layer is thermally hardenable.

5. A method for making lithographic printing plates according to claim 1 wherein said lithographic base having a hydrophilic surface is an electrochemically grained and anodized aluminum support.

6. A method for making lithographic printing plates according to claim 5 wherein said aluminum support is treated with polyvinylphosphonic acid.

* * * * *